(12) United States Patent
Yantchev

(10) Patent No.: US 11,264,966 B2
(45) Date of Patent: Mar. 1, 2022

(54) SOLIDLY-MOUNTED TRANSVERSELY-EXCITED FILM BULK ACOUSTIC RESONATOR WITH DIAMOND LAYERS IN BRAGG REFLECTOR STACK

(71) Applicant: Resonant Inc., Goleta, CA (US)

(72) Inventor: Ventsislav Yantchev, Sofia (BG)

(73) Assignee: Resonant Inc., Austin, TX (US)

( * ) Notice: Subject to any disclaimer, the term of this patent is extended or adjusted under 35 U.S.C. 154(b) by 58 days.

(21) Appl. No.: 16/896,147

(22) Filed: Jun. 8, 2020

(65) Prior Publication Data

US 2020/0304091 A1 Sep. 24, 2020

Related U.S. Application Data

(63) Continuation-in-part of application No. 16/779,306, filed on Jan. 31, 2020, now Pat. No. 11,165,407,
(Continued)

(51) Int. Cl.
*H03H 9/02* (2006.01)
*H03H 3/02* (2006.01)
(Continued)

(52) U.S. Cl.
CPC .......... *H03H 9/02228* (2013.01); *H03H 3/02* (2013.01); *H03H 9/02031* (2013.01);
(Continued)

(58) Field of Classification Search
CPC .. H03H 9/02228; H03H 3/04; H03H 9/02031; H03H 9/132; H03H 9/174;
(Continued)

(56) References Cited

U.S. PATENT DOCUMENTS 5,446,330 A 8/1995 Eda et al.
5,552,655 A 9/1996 Stokes et al.
(Continued)

FOREIGN PATENT DOCUMENTS

WO 2016017104 2/2016
WO 2018003273 A1 1/2018

OTHER PUBLICATIONS

Hryciw, A., "QCM Material Parameter", nanoFAB knowledge base, https://confluence.nanofab.ualberta.ca/ (Year: 2021).*
(Continued)

*Primary Examiner* — Hafizur Rahman
(74) *Attorney, Agent, or Firm* — SoCal IP Law Group LLP; Steven C. Sereboff

(57) ABSTRACT

Resonator devices, filter devices, and methods of fabrication are disclosed. A resonator device includes a substrate and a single-crystal piezoelectric plate having front and back surfaces. An acoustic Bragg reflector is sandwiched between a surface of the substrate and the back surface of the piezoelectric plate. An interdigital transducer (IDT) is formed on the front surface of the piezoelectric plate. The IDT and the piezoelectric plate are configured such that a radio frequency signal applied to the IDT excites a primary acoustic mode within the piezoelectric plate. The acoustic Bragg reflector comprises alternating $SiO_2$ and diamond layers and is configured to reflect the primary acoustic mode.

19 Claims, 11 Drawing Sheets

Related U.S. Application Data which is a continuation of application No. 16/438,141, filed on Jun. 11, 2019, now Pat. No. 10,601,392, which is a continuation-in-part of application No. 16/230,443, filed on Dec. 21, 2018, now Pat. No. 10,491,192.

(60) Provisional application No. 63/000,006, filed on Mar. 26, 2020, provisional application No. 62/818,564, filed on Mar. 14, 2019, provisional application No. 62/753,815, filed on Oct. 31, 2018, provisional application No. 62/753,809, filed on Oct. 31, 2018, provisional application No. 62/748,883, filed on Oct. 22, 2018, provisional application No. 62/741,702, filed on Oct. 5, 2018, provisional application No. 62/701,363, filed on Jul. 20, 2018, provisional application No. 62/685,825, filed on Jun. 15, 2018.

(51) Int. Cl.
*H03H 9/13* (2006.01)
*H03H 9/56* (2006.01)
*H03H 9/17* (2006.01)

(52) U.S. Cl.
CPC ............ *H03H 9/132* (2013.01); *H03H 9/175* (2013.01); *H03H 9/176* (2013.01); *H03H 9/562* (2013.01); *H03H 9/564* (2013.01); *H03H 9/568* (2013.01); *H03H 2003/025* (2013.01)

(58) Field of Classification Search
CPC ........ H03H 9/176; H03H 9/562; H03H 9/564; H03H 9/568; H03H 2003/023; H03H 2003/0442
USPC ......................................................... 333/192
See application file for complete search history.

(56) References Cited

U.S. PATENT DOCUMENTS

| | | |
|---|---|---|
| 5,726,610 A | 3/1998 | Allen et al. |
| 5,853,601 A | 12/1998 | Krishaswamy |
| 6,377,140 B1 | 4/2002 | Ehara et al. |
| 6,516,503 B1 | 2/2003 | Ikada et al. |
| 6,540,827 B1 | 4/2003 | Levy et al. |
| 6,707,229 B1 | 3/2004 | Martin |
| 6,710,514 B2 | 3/2004 | Ikada et al. |
| 7,345,400 B2 | 3/2008 | Nakao et al. |
| 7,463,118 B2 | 12/2008 | Jacobsen |
| 7,535,152 B2 | 5/2009 | Ogami et al. |
| 7,684,109 B2 | 3/2010 | Godshalk et al. |
| 7,728,483 B2 | 6/2010 | Tanaka |
| 7,868,519 B2 | 1/2011 | Umeda |
| 7,941,103 B2 | 5/2011 | Iwamoto et al. |
| 8,278,802 B1 | 10/2012 | Lee et al. |
| 8,294,330 B1 | 10/2012 | Abbott et al. |
| 8,344,815 B2 | 1/2013 | Yamanaka |
| 8,816,567 B2 | 8/2014 | Zuo et al. |
| 8,829,766 B2 | 9/2014 | Milyutin et al. |
| 8,932,686 B2 | 1/2015 | Hayakawa et al. |
| 9,093,979 B2 | 7/2015 | Wang |
| 9,130,145 B2 | 9/2015 | Martin et al. |
| 9,219,466 B2 | 12/2015 | Meltaus et al. |
| 9,276,557 B1 | 3/2016 | Nordquist et al. |
| 9,369,105 B1 | 6/2016 | Li |
| 9,425,765 B2 | 8/2016 | Rinaldi |
| 9,525,398 B1 | 12/2016 | Olsson |
| 9,640,750 B2 | 5/2017 | Nakanishi et al. |
| 9,748,923 B2 | 8/2017 | Kando et al. |
| 9,762,202 B2 | 9/2017 | Thalmayr et al. |
| 9,780,759 B2 | 10/2017 | Kimura et al. |
| 9,837,984 B2 | 12/2017 | Khlat et al. |
| 10,079,414 B2 | 9/2018 | Guyette et al. |
| 10,187,039 B2 | 1/2019 | Komatsu et al. |
| 10,200,013 B2 | 2/2019 | Bower et al. |
| 10,211,806 B2 | 2/2019 | Bhattacharjee |
| 10,284,176 B1 | 5/2019 | Solal |
| 10,491,192 B1 | 11/2019 | Plesski et al. |
| 10,601,392 B2 | 3/2020 | Plesski et al. |
| 10,637,438 B2 | 4/2020 | Garcia et al. |
| 10,644,674 B2 | 5/2020 | Takamine |
| 10,756,697 B2 | 8/2020 | Plesski et al. |
| 10,790,802 B2 | 9/2020 | Yantchev et al. |
| 10,797,675 B2 | 10/2020 | Plesski |
| 10,826,462 B2 | 11/2020 | Plesski et al. |
| 10,868,512 B2 | 12/2020 | Garcia et al. |
| 10,917,070 B2 | 2/2021 | Plesski et al. |
| 2002/0079986 A1 | 6/2002 | Ruby et al. |
| 2002/0158714 A1 | 10/2002 | Kaitila et al. |
| 2002/0189062 A1 | 12/2002 | Lin et al. |
| 2003/0080831 A1 | 5/2003 | Naumenko et al. |
| 2003/0199105 A1 | 10/2003 | Kub et al. |
| 2004/0100164 A1 | 5/2004 | Murata |
| 2004/0261250 A1 | 12/2004 | Kadota et al. |
| 2005/0185026 A1 | 8/2005 | Noguchi et al. |
| 2005/0218488 A1 | 10/2005 | Matsuo |
| 2005/0264136 A1 | 12/2005 | Tsutsumi et al. |
| 2006/0179642 A1 | 8/2006 | Kawamura |
| 2007/0182510 A1 | 8/2007 | Park |
| 2007/0188047 A1 | 8/2007 | Tanaka |
| 2007/0194863 A1 | 8/2007 | Shibata et al. |
| 2007/0267942 A1 | 11/2007 | Matsumoto et al. |
| 2008/0246559 A1 | 10/2008 | Ayazi |
| 2010/0064492 A1 | 3/2010 | Tanaka |
| 2010/0123367 A1 | 5/2010 | Tai et al. |
| 2011/0018389 A1 | 1/2011 | Fukano et al. |
| 2011/0018654 A1 | 1/2011 | Bradley et al. |
| 2011/0109196 A1 | 5/2011 | Goto |
| 2011/0278993 A1 | 11/2011 | Iwamoto |
| 2012/0286900 A1 | 11/2012 | Kadota et al. |
| 2013/0234805 A1 | 9/2013 | Takahashi |
| 2013/0271238 A1 | 10/2013 | Onda |
| 2013/0278609 A1 | 10/2013 | Stephanou et al. |
| 2013/0285768 A1* | 10/2013 | Watanabe ................ H03H 3/02 333/193 |
| 2013/0321100 A1 | 12/2013 | Wang |
| 2014/0130319 A1 | 5/2014 | Iwamoto |
| 2014/0145556 A1 | 5/2014 | Kadota |
| 2014/0151151 A1 | 6/2014 | Reinhardt |
| 2014/0152145 A1 | 6/2014 | Kando et al. |
| 2014/0173862 A1 | 6/2014 | Kando et al. |
| 2014/0225684 A1 | 8/2014 | Kando et al. |
| 2015/0042417 A1 | 2/2015 | Onodera et al. |
| 2015/0319537 A1 | 11/2015 | Perois et al. |
| 2015/0333730 A1 | 11/2015 | Meltaus |
| 2016/0028367 A1 | 1/2016 | Shealy |
| 2016/0182009 A1 | 6/2016 | Bhattacharjee |
| 2017/0063332 A1 | 3/2017 | Gilbert et al. |
| 2017/0179928 A1 | 6/2017 | Raihn et al. |
| 2017/0214381 A1 | 7/2017 | Bhattacharjee |
| 2017/0214387 A1 | 7/2017 | Burak et al. |
| 2017/0222617 A1 | 8/2017 | Mizoguchi |
| 2017/0222622 A1 | 8/2017 | Solal et al. |
| 2017/0370791 A1 | 12/2017 | Nakamura et al. |
| 2018/0005950 A1 | 1/2018 | Watanabe |
| 2018/0026603 A1 | 1/2018 | Iwamoto |
| 2018/0033952 A1 | 2/2018 | Yamamoto |
| 2018/0062615 A1 | 3/2018 | Kato et al. |
| 2018/0062617 A1 | 3/2018 | Yun et al. |
| 2018/0123016 A1 | 5/2018 | Gong |
| 2018/0191322 A1 | 7/2018 | Chang et al. |
| 2019/0068164 A1 | 2/2019 | Houlden et al. |
| 2019/0123721 A1 | 4/2019 | Takamine |
| 2019/0131953 A1 | 5/2019 | Gong |
| 2019/0273480 A1* | 9/2019 | Lin .................... H03H 9/02228 |
| 2019/0348966 A1 | 11/2019 | Campanella-Pineda |
| 2020/0036357 A1 | 1/2020 | Mimura |
| 2020/0235719 A1 | 7/2020 | Yantchev et al. |

(56) References Cited

OTHER PUBLICATIONS

Koné et al. "Guided acoustic wave resonators using an acoustic Bragg mirror", Appl. Phys. Lett. 96, 223504 (2010); https://doi.org/10.1063/1.3440370. (Year: 2010).*

T. Takai, H. Iwamoto, et al., "I.H.P.Saw Technology and its Application to Microacoustic Components (Invited)." 2017 IEEE International Ultrasonics Symposium, Sep. 6-9, 2017. pp. 1-8.

R. Olsson III, K. Hattar et al. "A high electromechanical coupling coefficient SH0 Lamb wave lithiumniobate micromechanical resonator and a method for fabrication" Sensors and Actuators A: Physical, vol. 209, Mar. 1, 2014, pp. 183-190.

M. Kadota, S. Tanaka, "Wideband acoustic wave resonators composed of hetero acoustic layer structure," Japanese Journal of Applied Physics, vol. 57, No. 7S1. Published Jun. 5, 2018. 5 pages.

Y. Yang, R. Lu et al. "Towards Ka Band Acoustics: Lithium Niobat Asymmetrical Mode Piezoelectric MEMS Resonators", Department of Electrical and Computer Engineering University of Illinois at Urbana-Champaign, May 2018. pp. 1-2.

Y. Yang, A. Gao et al. "5 GHZ Lithium Niobate MEMS Resonators With High FOM of 153", 2017 IEEE 30th International Conference in Micro Electro Mechanical Systems (MEMS). Jan. 22-26, 2017. pp. 942-945.

USPTO/ISA, International Search Report and Written Opinion for PCT Application No. PCT/US2019/036433 dated Aug. 29, 2019.

USPTO/ISA, International Search Report and Written Opinion for PCT Application No. PCT/US2019/058632 dated Jan. 17, 2020.

G. Manohar, "Investigation of Various Surface Acoustic Wave Design Configurations for Improved Sensitivity." Doctoral dissertation, University of South Florida, USA, Jan. 2012, 7 pages.

Ekeom, D. & Dubus, Bertrand & Volatier, A . . . (2006). Solidly mounted resonator (SMR) FEM-BEM simulation. 1474-1477. 10.1109/ULTSYM.2006.371.

Mizutaui, K. and Toda, K., "Analysis of lamb wave propagation characteristics in rotated Ycut Xpropagation LiNbO3 plates." Electron. Comm. Jpn. Pt. I, 69, No. 4 (1986): 47-55. doi:10.1002/ecja.4410690406.

Naumenko et al., "Optimal orientations of Lithium Niobate for resonator SAW filters", 2003 IEEE Ultrasonics Symposium—pp. 2110-2113. (Year: 2003).

Namdeo et al. "Simulation on Effects of Electrical Loading due to Interdigital Transducers in Surface Acoustic Wave Resonator", published in Procedia Engineering 64 ( 2013) of Science Direct pp. 322-330 (Year: 2013) 2013.

Rodriguez-Madrid et al., "Super-High-Frequency SAW Resonators on AlN/Diamond", IEEE Electron Device Letters, vol. 33, No. 4, Apr. 2012, pp. 495-497. Year: 2012) 2012.

A. C. Guyette, "Theory and Design of Intrinsically Switched Multiplexers With Optimum Phase Linearity," in IEEE Transactions on Microwave Theory and Techniques, vol. 61, No. 9, pp. 3254-3264, Sep. 2013, doi: 10.1109/TMTT.2013.2274963. Sep. 2013.

Yanson Yang, Ruochen Lu, Songbin Gong, High Q Antisymmetric Mode Lithium Niobate MEMS Resonators With Spurious Mitigation, Journal of Microelectromechanical Systems, vol. 29, No. 2, Apr. 2020. Apr. 2, 2020.

Yu-Po Wong, Luyan Qiu, Naoto Matsuoka, Ken-ya Hashimoto, Broadband Piston Mode Operation for First-order Antisymmetric Mode Resonators, 2020 IEEE International Ultrasonics Symposium, Sep. 2020. Sep. 2020.

Buchanan "Ceramit Materials for Electronics" 3rd Edition, first published in 2004 by Marcel Dekker, Inc. pp. 496 (Year 2004). 00 Jan. 2004.

Sorokin et al. Study of Microwave Acoustic Attenuation in a Multi-frequency Bulk Acoustic Resonator Based on a Synthetic Diamond Single Crystal Published in Acoustical Physics, vol. 61, No. 6, 2015 p. 675 (Year 2015) 00 Jan. 2015.

Zou, Jie "High-Performance Aluminum Nitride Lamb Wave Resonators for RF Front-End Technology" University of California, Berkeley, Summer 2015, pp. 63 (Year 2015) 00 Jan. 2015.

Santosh, G. , Surface acoustic wave devices on silicon using patterned and thin film ZnO, Ph D. thesis, Feb. 2016, Indian Institute of technology Guwahati, Assam, India Feb. 2016.

Merriam Webster, dictionary meaning of the word "diaphragm", since 1828, Merriam Webster (Year: 1828) 1828.

Kadota et al. "5.4 Ghz Lamb Wave Resonator on LiNbO3 Thin Crystal Plate and Its Application," published in Japanese Journal of Applied Physics 50 (2011) 07HD11. (Year: 2011) 2011.

USPTO/ISA, International Search Report and Written Opinion for PCT Application No. PCT/US2020/45654 dated Oct. 29, 2020. 2020.

Safari et al. "Piezoelectric for Transducer Applications" published by Elsevier Science Ltd., pp. 4 (Year: 2000). 2020.

Moussa et al. Review on Triggered Liposomal Drug Delivery with a Focus on Ultrasound 2015, Bentham Science Publishers, pp. 16 (Year 2005) 2005.

Acoustic Properties of Solids ONDA Corporation 592 Weddell Drive, Sunnyvale, CA 94089, Apr. 11, 2003, pp. 5 (Year 2003). 2003.

Bahreyni, B. Fabrication and Design of Resonant Microdevices Andrew William, Inc. 2018, NY (Year 2008). 2008.

Material Properties of Tibtech Innovations, © 2018 TIBTECH Innovations (Year 2018). 2018.

* cited by examiner

SOLIDLY-MOUNTED TRANSVERSELY-EXCITED FILM BULK ACOUSTIC RESONATOR WITH DIAMOND LAYERS IN BRAGG REFLECTOR STACK

RELATED APPLICATION INFORMATION

This patent claims priority from provisional patent application 63/000,006, filed Mar. 26, 2020, titled SM-XBAR WITH DIAMOND LAYERS IN ACOUSTIC BRAGG REFLECTOR. This patent is a continuation-in-part of application Ser. No. 16/779,306, filed Jan. 31, 2020, titled SOLIDLY-MOUNTED TRANSVERSELY-EXCITED FILM BULK ACOUSTIC RESONATOR, now U.S. Pat. No. 11,165,407, which is a continuation of application Ser. No. 16/438,141, filed 11 Jun. 2019, titled SOLIDLY-MOUNTED TRANSVERSELY-EXCITED FILM BULK ACOUSTIC RESONATOR, now U.S. Pat. No. 10,601,392, which claims priority from provisional patent application 62/753,809, filed Oct. 31, 2018, titled SOLIDLY MOUNTED SHEAR-MODE FILM BULK ACOUSTIC RESONATOR, and provisional patent application 62/818,564, filed Mar. 14, 2019, titled SOLIDLY MOUNTED XBAR. Application Ser. No. 16/438,141 is a continuation-in-part of application Ser. No. 16/230,443, filed Dec. 21, 2018, titled TRANSVERSELY-EXCITED FILM BULK ACOUSTIC RESONATOR, now U.S. Pat. No. 10,491,192, which claims priority from the following provisional applications: application 62/685,825, filed Jun. 15, 2018, entitled SHEAR-MODE FBAR (XBAR); application 62/701,363, filed Jul. 20, 2018, entitled SHEAR-MODE FBAR (XBAR); application 62/741,702, filed Oct. 5, 2018, entitled 5 GHZ LATERALLY-EXCITED BULK WAVE RESONATOR (XBAR); application 62/748,883, filed Oct. 22, 2018, entitled SHEAR-MODE FILM BULK ACOUSTIC RESONATOR; and application 62/753,815, filed Oct. 31, 2018, entitled LITHIUM TANTALATE SHEAR-MODE FILM BULK ACOUSTIC RESONATOR. All of these applications are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to radio frequency filters using acoustic wave resonators, and specifically to filters for use in communications equipment.

Description of the Related Art

A radio frequency (RF) filter is a two-port device configured to pass some frequencies and to stop other frequencies, where "pass" means transmit with relatively low signal loss and "stop" means block or substantially attenuate. The range of frequencies passed by a filter is referred to as the "pass-band" of the filter. The range of frequencies stopped by such a filter is referred to as the "stop-band" of the filter. A typical RF filter has at least one pass-band and at least one stop-band. Specific requirements on a pass-band or stop-band depend on the specific application. For example, a "pass-band" may be defined as a frequency range where the insertion loss of a filter is better than a defined value such as 1 dB, 2 dB, or 3 dB. A "stop-band" may be defined as a frequency range where the insertion loss of a filter is greater than a defined value such as 20 dB, 30 dB, 40 dB, or greater depending on application.

RF filters are used in communications systems where information is transmitted over wireless links. For example, RF filters may be found in the RF front-ends of cellular base stations, mobile telephone and computing devices, satellite transceivers and ground stations, IoT (Internet of Things) devices, laptop computers and tablets, fixed point radio links, and other communications systems. RF filters are also used in radar and electronic and information warfare systems.

RF filters typically require many design trade-offs to achieve, for each specific application, the best compromise between performance parameters such as insertion loss, rejection, isolation, power handling, linearity, size and cost. Specific design and manufacturing methods and enhancements can benefit simultaneously one or several of these requirements.

Performance enhancements to the RF filters in a wireless system can have broad impact to system performance. Improvements in RF filters can be leveraged to provide system performance improvements such as larger cell size, longer battery life, higher data rates, greater network capacity, lower cost, enhanced security, higher reliability, etc. These improvements can be realized at many levels of the wireless system both separately and in combination, for example at the RF module, RF transceiver, mobile or fixed sub-system, or network levels.

The desire for wider communication channel bandwidths will inevitably lead to the use of higher frequency communications bands. The current LTE™ (Long Term Evolution) specification defines frequency bands from 3.3 GHz to 5.9 GHz. Some of these bands are not presently used. Future proposals for wireless communications include millimeter wave communication bands with frequencies up to 28 GHz.

High performance RF filters for present communication systems commonly incorporate acoustic wave resonators including surface acoustic wave (SAW) resonators, bulk acoustic wave (BAW) resonators, film bulk acoustic wave resonators (FBAR), and other types of acoustic resonators. However, these existing technologies are not well-suited for use at the higher frequencies proposed for future communications networks.

Throughout this description, elements appearing in figures are assigned three-digit or four-digit reference designators, where the two least significant digits are specific to the element and the one or two most significant digit is the figure number where the element is first introduced. An element that is not described in conjunction with a figure may be presumed to have the same characteristics and function as a previously-described element having the same reference designator.

DETAILED DESCRIPTION

Description of Apparatus

Figure 1:
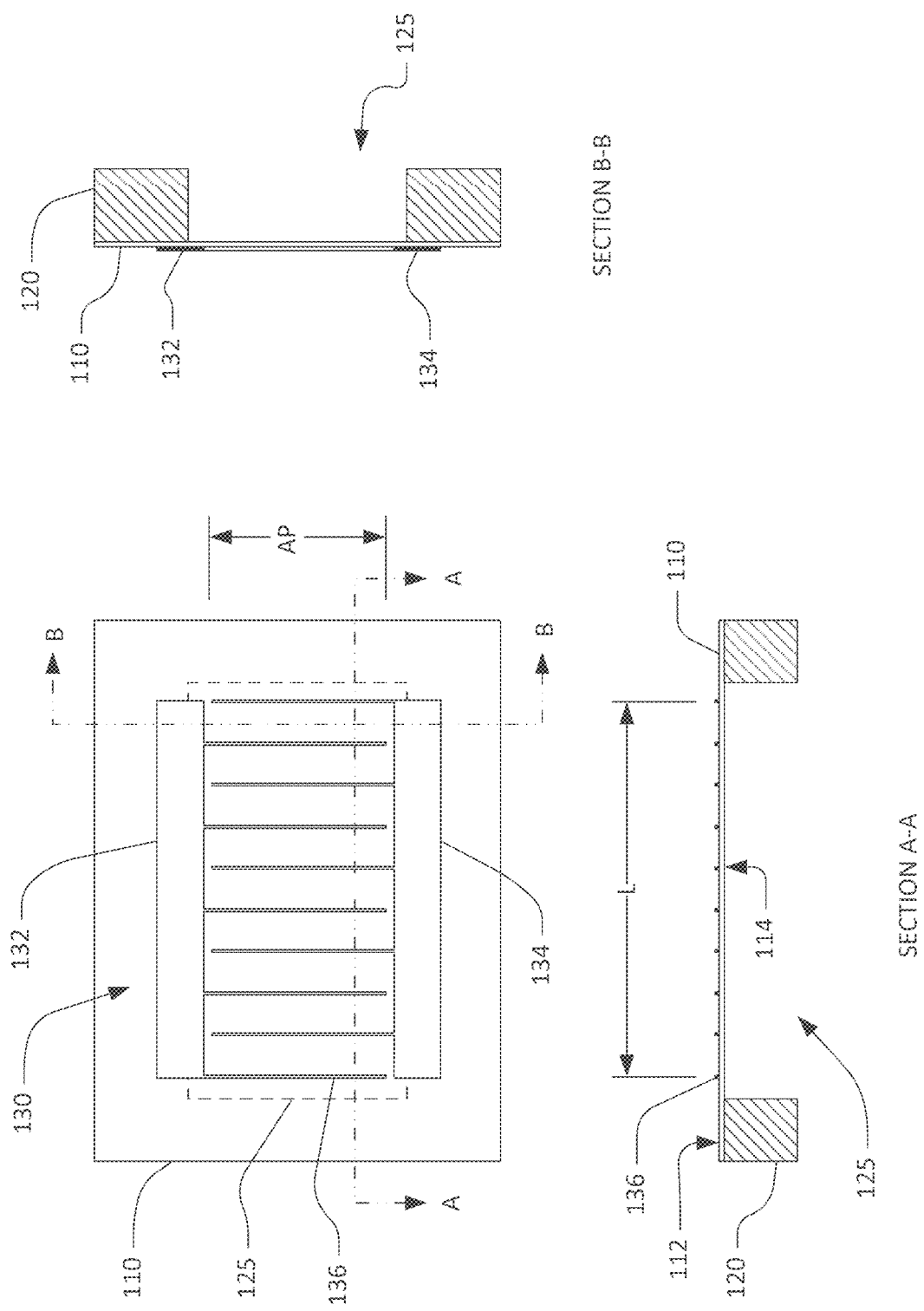
FIG. 1 includes a schematic plan view and schematic cross-sectional views of a transversely-excited film bulk acoustic resonator (XBAR).

FIG. 1 shows a simplified schematic top view and orthogonal cross-sectional views of a transversely-excited film bulk acoustic resonator (XBAR) 100 as described in application Ser. No. 16/230,443, TRANSVERSELY-EXCITED FILM BULK ACOUSTIC RESONATOR. XBAR resonators such as the resonator 100 may be used in a variety of RF filters including band-reject filters, band-pass filters, duplexers, and multiplexers. XBARs are particularly suited for use in filters for communications bands with frequencies above 3 GHz.

The XBAR 100 is made up of a thin film conductor pattern formed on a surface of a piezoelectric plate 110 having parallel front and back surfaces 112, 114, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces. However, XBARs may be fabricated on piezoelectric plates with other crystallographic orientations.

The back surface 114 of the piezoelectric plate 110 is attached to a substrate 120 that provides mechanical support to the piezoelectric plate 110. The substrate 120 may be, for example, silicon, sapphire, quartz, or some other material. The piezoelectric plate 110 may be bonded to the substrate 120 using a wafer bonding process, or grown on the substrate 120, or attached to the substrate in some other manner. The piezoelectric plate may be attached directly to the substrate or may be attached to the substrate via one or more intermediate material layers.

The conductor pattern of the XBAR 100 includes an interdigital transducer (IDT) 130. The IDT 130 includes a first plurality of parallel fingers, such as finger 136, extending from a first busbar 132 and a second plurality of fingers extending from a second busbar 134. The first and second pluralities of parallel fingers are interleaved. The interleaved fingers overlap for a distance AP, commonly referred to as the "aperture" of the IDT. The center-to-center distance L between the outermost fingers of the IDT 130 is the "length" of the IDT.

The first and second busbars 132, 134 serve as the terminals of the XBAR 100. A radio frequency or microwave signal applied between the two busbars 132, 134 of the IDT 130 excites an acoustic wave within the piezoelectric plate 110. As will be discussed in further detail, the excited acoustic wave is a bulk shear wave that propagates in the direction normal to the surface of the piezoelectric plate 110, which is also normal, or transverse, to the direction of the electric field created by the IDT fingers. Thus, the XBAR is considered a transversely-excited film bulk wave resonator.

A cavity 125 is formed in the substrate 120 such that the portion of the piezoelectric plate 110 containing the IDT 130 is suspended over the cavity 125 without contacting the substrate 120. "Cavity" has its conventional meaning of "an empty space within a solid body." The cavity 125 may be a hole completely through the substrate 120 (as shown in Section A-A and Section B-B) or a recess in the substrate 120. The cavity 125 may be formed, for example, by selective etching of the substrate 120 before or after the piezoelectric plate 110 and the substrate 120 are attached. As shown in FIG. 1, the cavity 125 has a rectangular shape with an extent greater than the aperture AP and length L of the IDT 130. A cavity of an XBAR may have a different shape, such as a regular or irregular polygon. The cavity of an XBAR may have more or fewer than four sides, which may be straight or curved.

For ease of presentation in FIG. 1, the geometric pitch and width of the IDT fingers is greatly exaggerated with respect to the length (dimension L) and aperture (dimension AP) of the XBAR. A typical XBAR has more than ten parallel fingers in the IDT 110. An XBAR may have hundreds, possibly thousands, of parallel fingers in the IDT 110. Similarly, the thickness of the fingers in the cross-sectional views is greatly exaggerated.

Figure 2:
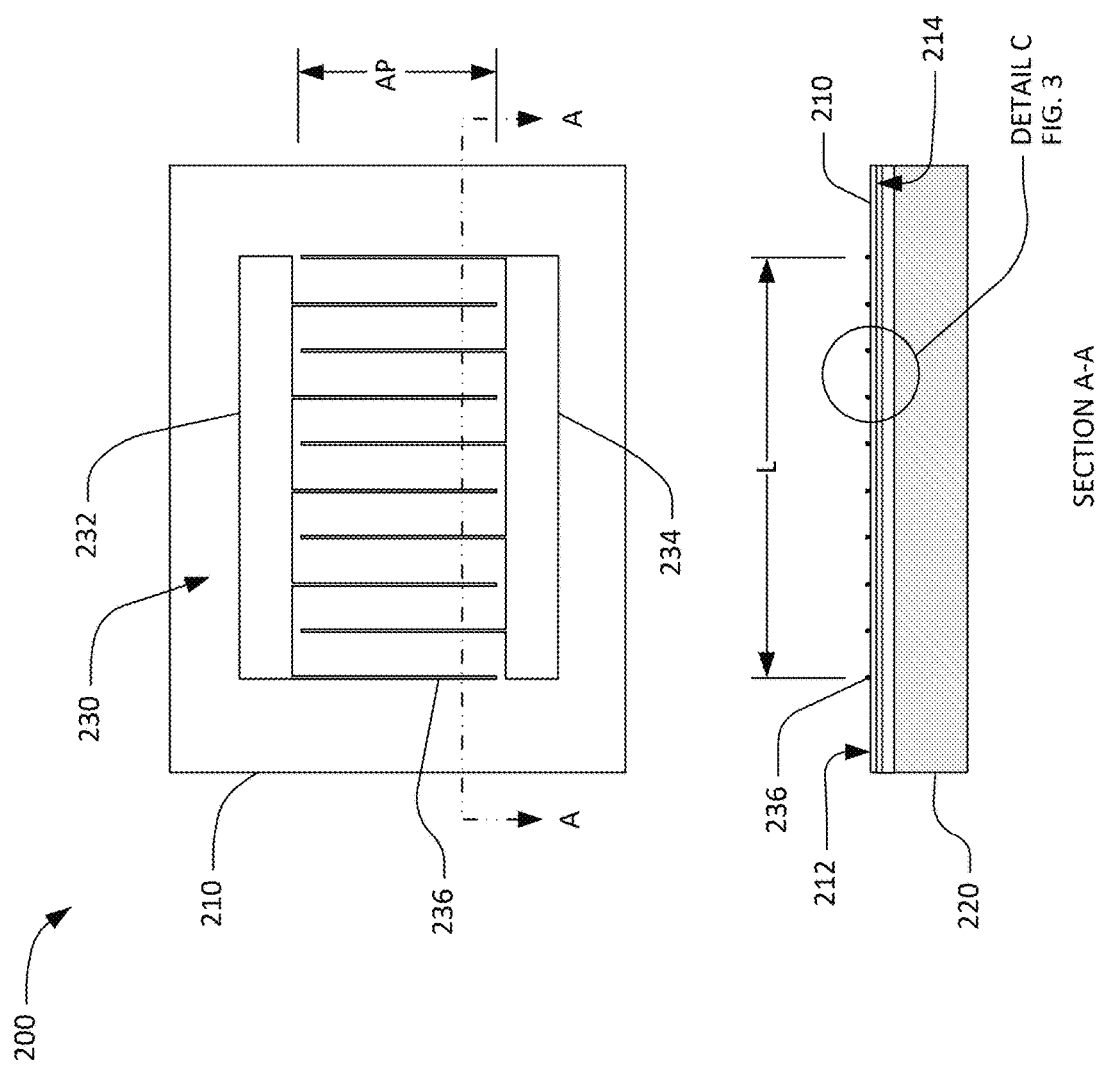
FIG. 2 includes a schematic plan view and a schematic cross-sectional view of a solidly-mounted transversely-excited film bulk acoustic resonator (SM XBAR).

FIG. 2 shows a simplified schematic top view and an orthogonal cross-sectional view of a solidly-mounted transversely-excited film bulk acoustic resonator (SM XBAR) 200. SM XBAR resonators such as the resonator 200 may be used in a variety of RF filters including band-reject filters, band-pass filters, duplexers, and multiplexers. SM XBARs are particularly suited for use in filters for communications bands with frequencies above 3 GHz.

The SM XBAR 200 is made up of a thin film conductor pattern formed on a front surface 212 of a piezoelectric plate 210 having parallel front and back surfaces 212, 214, respectively. The piezoelectric plate is a thin single-crystal layer of a piezoelectric material such as lithium niobate, lithium tantalate, lanthanum gallium silicate, gallium nitride, or aluminum nitride. The piezoelectric plate is cut such that the orientation of the X, Y, and Z crystalline axes with respect to the front and back surfaces is known and consistent. In the examples presented in this patent, the piezoelectric plates are Z-cut, which is to say the Z axis is normal to the surfaces of the plate. However, SM XBARs may be fabricated on piezoelectric plates with other crystallographic orientations.

The back surface 214 of the piezoelectric plate 210 is attached to, and mechanically supported by, a substrate 220. The substrate 220 may be, for example, silicon, sapphire, quartz, or some other material. As will be described subsequently, the piezoelectric plate 210 may be attached to the substrate 220 via a plurality of intermediate material layers.

The conductor pattern of the SM XBAR 200 includes an interdigital transducer (IDT) 230. The IDT 230 includes a first plurality of parallel fingers, such as finger 236, extending from a first busbar 232 and a second plurality of fingers extending from a second busbar 234. The first and second pluralities of parallel fingers are interleaved. The interleaved fingers overlap for a distance AP, commonly referred to as the "aperture" of the IDT. The center-to-center distance L between the outermost fingers of the IDT 230 is the "length" of the IDT. Each finger of the first and second pluralities of fingers may be parallel to the X axis of the piezoelectric plate 210.

The first and second busbars 232, 234 serve as the terminals of the SM XBAR 200. A radio frequency or microwave signal applied between the two busbars 232, 234 of the IDT 230 excites an acoustic wave within the piezoelectric plate 210. As will be discussed in further detail, the excited acoustic wave is a bulk shear wave that propagates in the direction normal to the surface of the piezoelectric plate 210, which is also normal, or transverse, to the direction of the electric field created by the IDT fingers. Thus, the SM XBAR is considered a transversely-excited film bulk wave resonator.

For ease of presentation in FIG. 2, the geometric pitch and width of the IDT fingers are greatly exaggerated with respect to the length (dimension L) and aperture (dimension AP) of the SM XBAR. A typical SM XBAR has more than ten parallel fingers in the IDT 210. An SM XBAR may have hundreds, possibly thousands, of parallel fingers in the IDT 210. Similarly, the thickness of the fingers in the cross-sectional views is greatly exaggerated.

Figure 3:
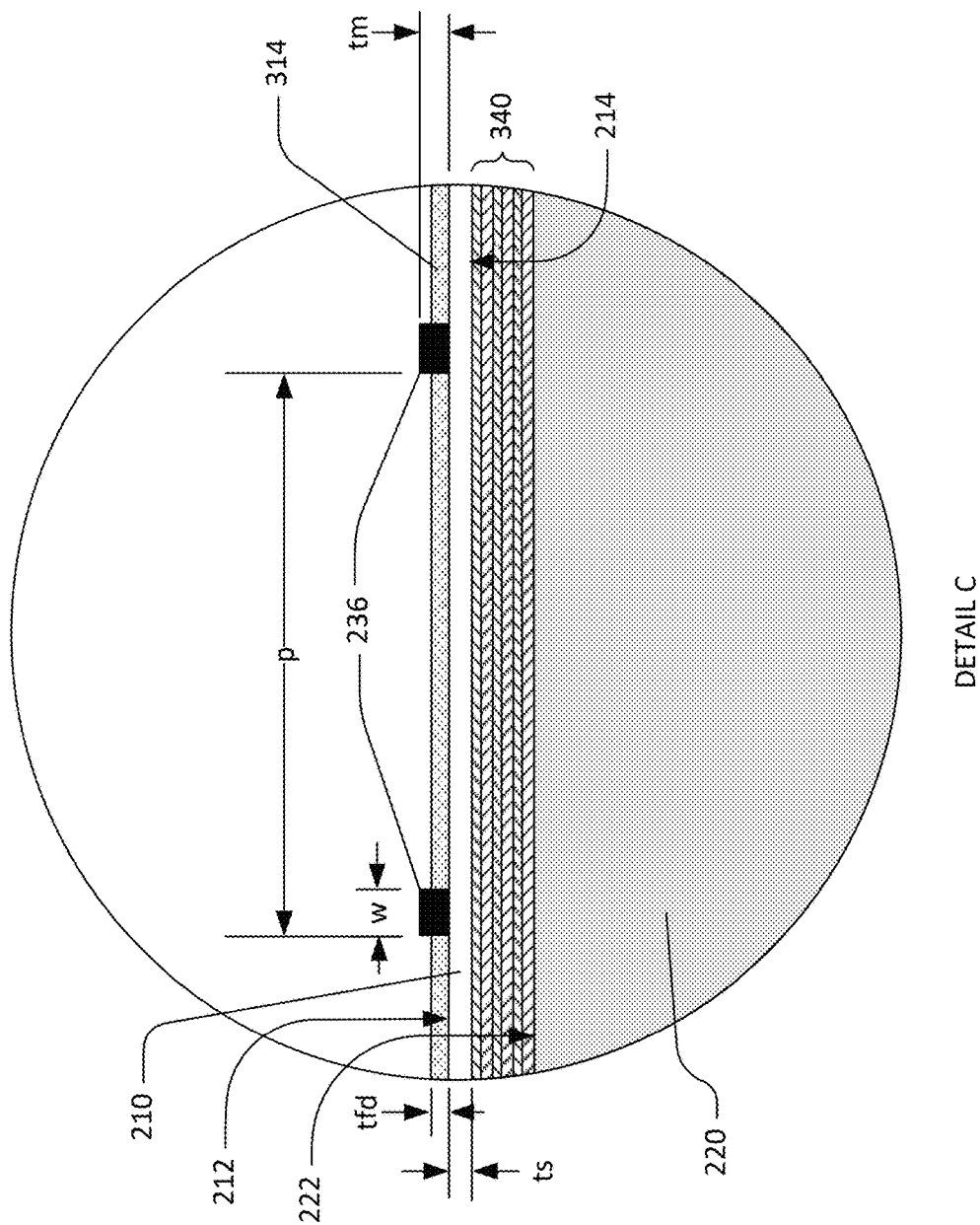
FIG. 3 is an expanded schematic cross-sectional view of a portion of the SM XBAR of FIG. 2.

FIG. 3 shows a detailed schematic cross-sectional view of the SM XBAR 200. The piezoelectric plate 210 is a single-crystal layer of piezoelectrical material having a thickness ts. ts may be, for example, 100 nm to 1500 nm. Application Ser. No. 16/230,443, TRANSVERSELY-EXCITED FILM BULK ACOUSTIC RESONATOR, includes simulation data for XBARs on piezoelectric plates having thickness from 200 nm to 1000 nm. When used in filters for LTE™ bands from 3.4 GHZ to 6 GHz (e.g. bands 42, 43, 46), the thickness ts may be, for example, 200 nm to 500 nm.

A front-side dielectric layer 314 may optionally be formed on the front surface 212 of the piezoelectric plate 210. The front-side dielectric layer 314 has a thickness tfd. The front-side dielectric layer 314 may be formed between the IDT fingers 236. Although not shown in FIG. 2, the front side dielectric layer 314 may also be deposited over the IDT fingers 236. The front-side dielectric layer 314 may be a non-piezoelectric dielectric material, such as silicon dioxide or silicon nitride. tfd may be, for example, 0 to 500 nm.

The IDT fingers 238 may be aluminum or a substantially aluminum alloy, copper or a substantially copper alloy, beryllium, gold, or some other conductive material. Thin (relative to the total thickness of the conductors) layers of other metals, such as chromium or titanium, may be formed under and/or over the fingers to improve adhesion between the fingers and the piezoelectric plate 210 and/or to passivate or encapsulate the fingers. The busbars (232, 234 in FIG. 2) of the IDT may be made of the same or different materials as the fingers.

Dimension p is the center-to-center spacing or "pitch" of the IDT fingers, which may be referred to as the pitch of the IDT and/or the pitch of the SM XBAR. Dimension w is the width or "mark" of the IDT fingers. The IDT of an SM XBAR differs substantially from the IDTs used in surface acoustic wave (SAW) resonators. In a SAW resonator, the pitch of the IDT is one-half of the acoustic wavelength at the resonance frequency. Additionally, the mark-to-pitch ratio of a SAW resonator IDT is typically close to 0.5 (i.e. the mark or finger width w is about one-fourth of the acoustic wavelength at resonance). In an SM XBAR, the pitch p of the IDT is typically 2 to 20 times the width w of the fingers. In addition, the pitch p of the IDT is typically 2 to 20 times the thickness is of the piezoelectric slab 212. The width of the IDT fingers in an SM XBAR is not constrained to one-fourth of the acoustic wavelength at resonance. For example, the width of SM XBAR IDT fingers may be 500 nm or greater, such that the IDT can be fabricated using optical lithography. The thickness tm of the IDT fingers may be from 100 nm to about equal to the width w. The thickness of the busbars (132, 134 in FIG. 1) of the IDT may be the same as, or greater than, the thickness tm of the IDT fingers.

An acoustic Bragg reflector 340 is sandwiched between a surface 222 of the substrate 220 and the back surface 214 of the piezoelectric plate 110. The term "sandwiched" means the acoustic Bragg reflector 340 is both disposed between and physically connected to a surface 222 of the substrate 220 and the back surface 214 of the piezoelectric plate 210. In some circumstances, thin layers of additional materials may be disposed between the acoustic Bragg reflector 340 and the surface 222 of the substrate 220 and/or between the Bragg reflector 340 and the back surface 214 of the piezoelectric plate 210. Such additional material layers may be present, for example, to facilitate bonding the piezoelectric plate 210, the acoustic Bragg reflector 340, and the substrate 220.

The acoustic Bragg reflector 340 includes multiple layers that alternate between materials having high acoustic impedance and materials have low acoustic impedance. "High" and "low" are relative terms. For each layer, the standard for comparison is the adjacent layers. Each "high" acoustic impedance layer has an acoustic impedance higher than that of both the adjacent low acoustic impedance layers. Each "low" acoustic impedance layer has an acoustic impedance lower than that of both the adjacent high acoustic impedance layers. Each of the layers has a thickness equal to, or about, one-fourth of the acoustic wavelength at or near a resonance frequency of the SM XBAR 200. Materials having comparatively low acoustic impedance include silicon dioxide, silicon oxycarbide, aluminum, and certain plastics such as cross-linked polyphenylene polymers. Materials having comparatively high acoustic impedance include silicon nitride, aluminum nitride, silicon carbide, and metals such as molybdenum, tungsten, gold, and platinum. All of the high acoustic impedance layers of the acoustic Bragg reflector 340 are not necessarily the same material, and all of the low acoustic impedance layers are not necessarily the same material. In the example of FIG. 2, the acoustic Bragg reflector 340 has a total of six layers. An acoustic Bragg reflector may have more than, or less than, six layers.

Figure 4:
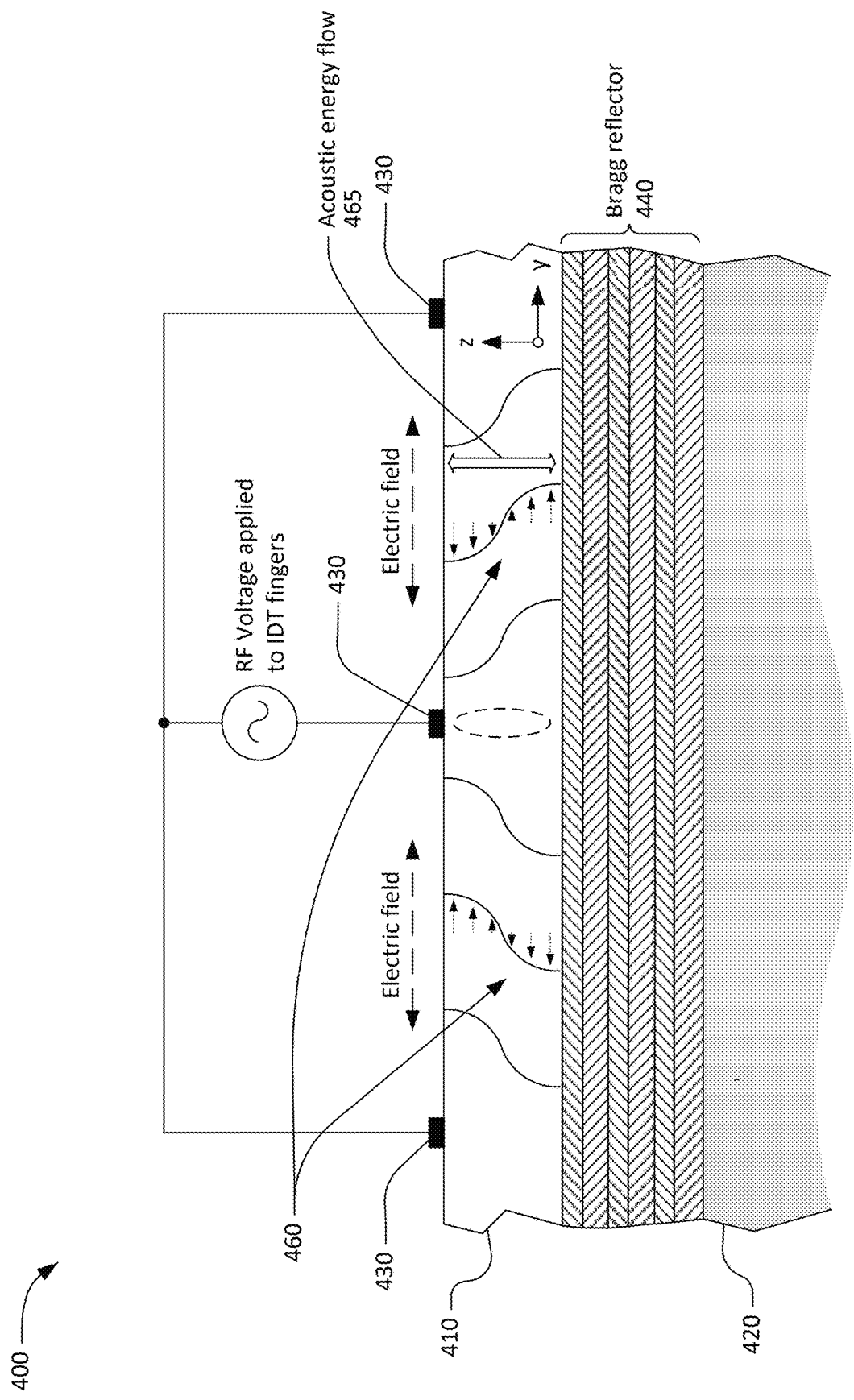
FIG. 4 is a graphic illustrating a shear primary acoustic mode in an SM XBAR.

FIG. 4 is a graphical illustration of the primary acoustic mode in a SM XBAR 400. FIG. 4 shows a small portion of the SM XBAR 400 including a piezoelectric plate 410 and three interleaved IDT fingers 430. The piezoelectric plate 410 may be single-crystal lithium niobate cut such that the z-axis is normal to the surfaces of the plate. The IDT fingers may be oriented parallel to the x-axis of the plate such that the y-axis is normal to the fingers.

An RF voltage applied to the interleaved fingers 430 creates a time-varying electric field between the fingers. In the regions between the IDT fingers 430, the direction of the electric field is predominantly lateral, or parallel to the surface of the piezoelectric plate 410, and orthogonal to the length of the IDT fingers, as indicated by the dashed arrows labeled "electric field". Due to the high dielectric constant of the piezoelectric plate, the electric field is highly concentrated in the plate relative to the air. The lateral electric field excites acoustic waves in the piezoelectric plate 410. In an XBAR, the piezoelectric plate and the IDT are configured such that the lateral electric field causes shear deformation, and thus strongly excites shear-mode acoustic waves, in the piezoelectric plate 410. In this context, "shear deformation" is defined as deformation in which parallel planes in a material remain parallel and maintain a constant distance while translating relative to each other. "Shear acoustic waves" are defined as acoustic waves in a medium that result in shear deformation of the medium. The shear deformations in the piezoelectric plate 410 are represented by the curves 460, with the adjacent small arrows providing a schematic indication of the direction and magnitude of atomic motion. The degree of atomic motion, as well as the thickness of the piezoelectric plate 410, have been greatly exaggerated for ease of visualization. While the atomic motions are predominantly lateral (i.e. horizontal as shown in FIG. 4), the direction of acoustic energy flow of the primary shear acoustic mode is substantially orthogonal to the surface of the piezoelectric plate, as indicated by the arrow 465. Other secondary or spurious acoustic modes may also be excited in addition to the primary shear acoustic mode.

In other acoustic wave resonators using a similar configuration, the piezoelectric plate may be configured such that an RF signal applied to the IDT excites some other form of primary acoustic mode in which the direction of acoustic energy flow is substantially parallel to the surface of the piezoelectric plate.

An acoustic Bragg reflector 440 is sandwiched between the piezoelectric plate 410 and a substrate 420. The acoustic Bragg reflector 440 reflects the acoustic waves of the primary acoustic mode to keep the acoustic energy (arrow 465) predominantly confined to the piezoelectric plate 410. The acoustic Bragg reflector 440 for an XBAR consists of alternating layers of materials having relatively high and relatively low acoustic impedance, with each layer having a thickness of about one-quarter of the wavelength of the shear acoustic waves (arrow 465) at resonance frequency of the XBAR 400. In the example of FIG. 4, the acoustic Bragg reflector 440 has a total of six layers. An acoustic Bragg reflector may have more than, or less than, six layers.

Figure 5:
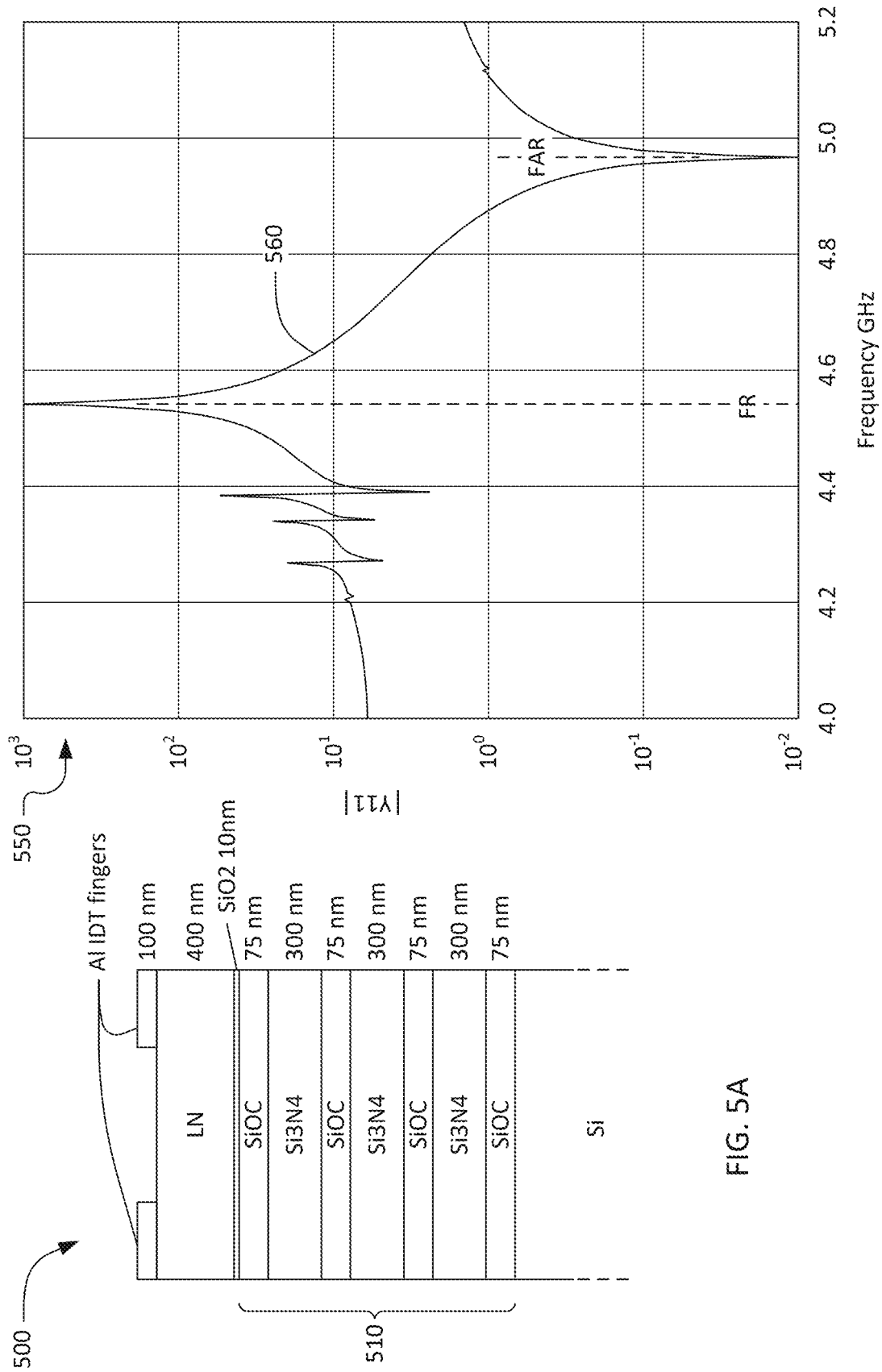
FIG. 5A is an expanded schematic cross-sectional view of a portion of a first exemplary SM XBAR.
FIG. 5B is a chart of the admittance of the first exemplary SM XBAR.

FIG. 5A is a schematic cross-sectional view of a SM XBAR 500 with an acoustic Bragg reflector 510 comprising alternating low acoustic impedance and high acoustic impedance dielectric layers, as described in U.S. Pat. No. 10,601,392. The piezoelectric plate in this example is Z-cut (i.e. Z axis normal to the plate) lithium niobate (LN) with a thickness of 400 nm. The piezoelectric plate may be rotated Z-cut or rotated Y-cut LN. The IDT fingers are aluminum with a thickness of 100 nm. The pitch and width of the IDT fingers are 5 um and 1 um, respectively. The IDT is oriented such that the y-axis of the piezoelectric plate is normal to the IDT fingers. The acoustic Bragg reflector 510 has a total of seven layers. The low acoustic impedance layers are SiOC 75 nm thick. The high acoustic impedance layers are Si3N4 300 nm thick. The substrate is silicon. A 10 nm layer of SiO2 may be used to provide adhesion between the piezoelectric plate and the adjacent SiOC layer.

FIG. 5B is a chart 550 with a plot 560 of the normalized magnitude of the admittance (on a logarithmic scale) of SM XBAR 500 of FIG. 5A as a function of frequency. The admittance plot 560 for the simulated SM XBAR 500 exhibits a high Q resonance at a frequency FR of 4539 MHz and a high Q anti-resonance at a frequency FAR of 4965 MHz. The difference between the resonance and antiresonance frequencies is 424 MHz, or about 9.3% of the resonance frequency.

Figure 6:
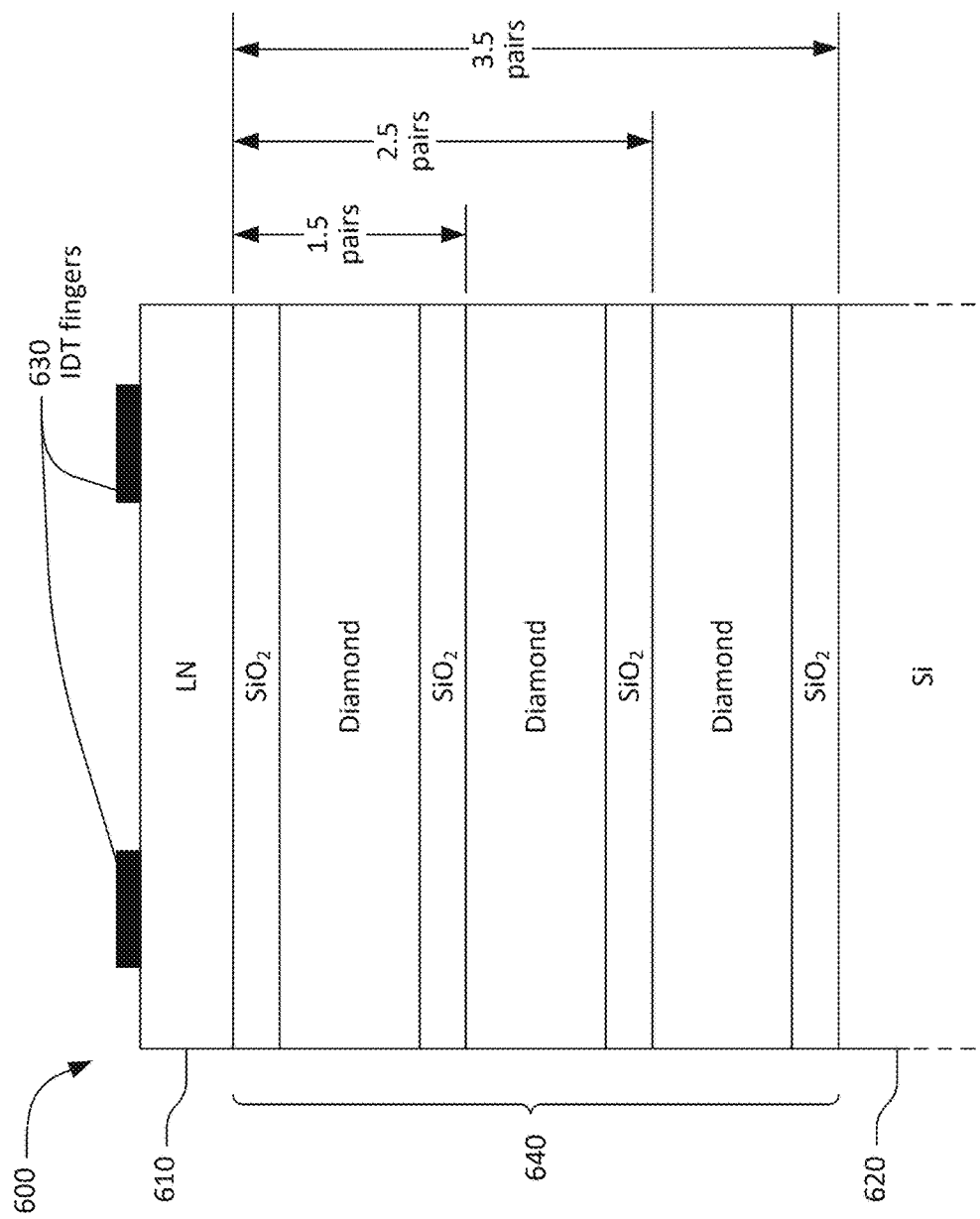
FIG. 6 is an expanded schematic cross-sectional view of a portion of a second exemplary SM XBAR including diamond layers in the acoustic Bragg reflector.

FIG. 6 is a schematic cross-sectional view of an improved SM XBAR 600 with an acoustic Bragg reflector 640 comprising alternating low acoustic impedance and high acoustic impedance dielectric layers. The piezoelectric plate 610 may be Z-cut, rotated Z-cut or rotated Y-X cut lithium niobate (LN) with a thickness from about 300 nm to about 600 nm. The substrate 620 may be silicon or some other material. The IDT fingers 630 may be aluminum, copper, molybdenum, or some other metal. The thickness of the IDT finger 620 may be from about 100 nm to about double the thickness of the piezoelectric plate 610. The pitch of the IDT fingers is typically about 6 times to about 12.5 times the thickness of the piezoelectric plate 610. The ratio of the width of the IDT fingers to the pitch of the IDT fingers is typically about 0.2 to 0.35. As shown, the acoustic Bragg reflector 640 has a total of seven layers. An acoustic Bragg reflector may have more than or fewer than seven layers.

In the acoustic Bragg reflector 640, the low acoustic impedance layers are $SiO_2$. In this context, "$SiO_2$" encompasses nonstoichiometric $SiO_x$ where x is approximately 2. The high acoustic impedance layers are diamond. Diamond has very high acoustic impedance, which enables construction of an efficient acoustic Bragg reflector with a relatively small number of layers. The acoustic Bragg reflector 640 illustrated in FIG. 6 has seven layers, or 3½ pairs of layers. An acoustic Bragg reflector may have more or fewer than seven layers.

In high power applications such as transmit filters for communication devices, acoustic and resistive losses generate heat in the IDT fingers 630 and piezoelectric layer 610, causing the temperature of these elements to increase. The amount of temperature increase depends on how efficiently the heat is conducted away from these elements. Thin diamond films have thermal conductivity of 530 w/mK to 1370 w/mK depending on deposition conditions. The thermal conductivity of diamond is roughly five to seven times the thermal conductivity of aluminum. The diamond layers in the acoustic Bragg reflector 640 efficiently conduct heat away from the resonator and minimize the temperature rise of the IDT fingers 630 and piezoelectric layer 610.

The Q-factor of an acoustic resonator is defined as the energy stored in the resonator divided by the energy lost during one radian of the RF input to the resonator. The energy lost in the resonator has various components including resistive losses in the conductors, acoustic or viscose losses in the conductors and piezoelectric plate, energy lost to spurious resonant modes, and, for SM-XBARs, energy lost by leakage through the acoustic Bragg reflector into the substrate. Individual Q-factors may be defined for each of the loss components such that $$1/Q = 1/Q_{BR} + 1/Q_R + 1/Q_A + \ldots \qquad (1)$$

where Q is the overall Q-factor of the resonator and $Q_{BR}$, $Q_R$, and $Q_A$ are the Q-factors for leakage through the Bragg grating, resistive losses, and acoustic losses, respectively. $Q_{BR}$ is equivalent to the Q-factor of an otherwise ideal resonator with no losses other than leakage through the acoustic Bragg reflector. Many of these Q-factors are dependent on frequency.

Figure 7:
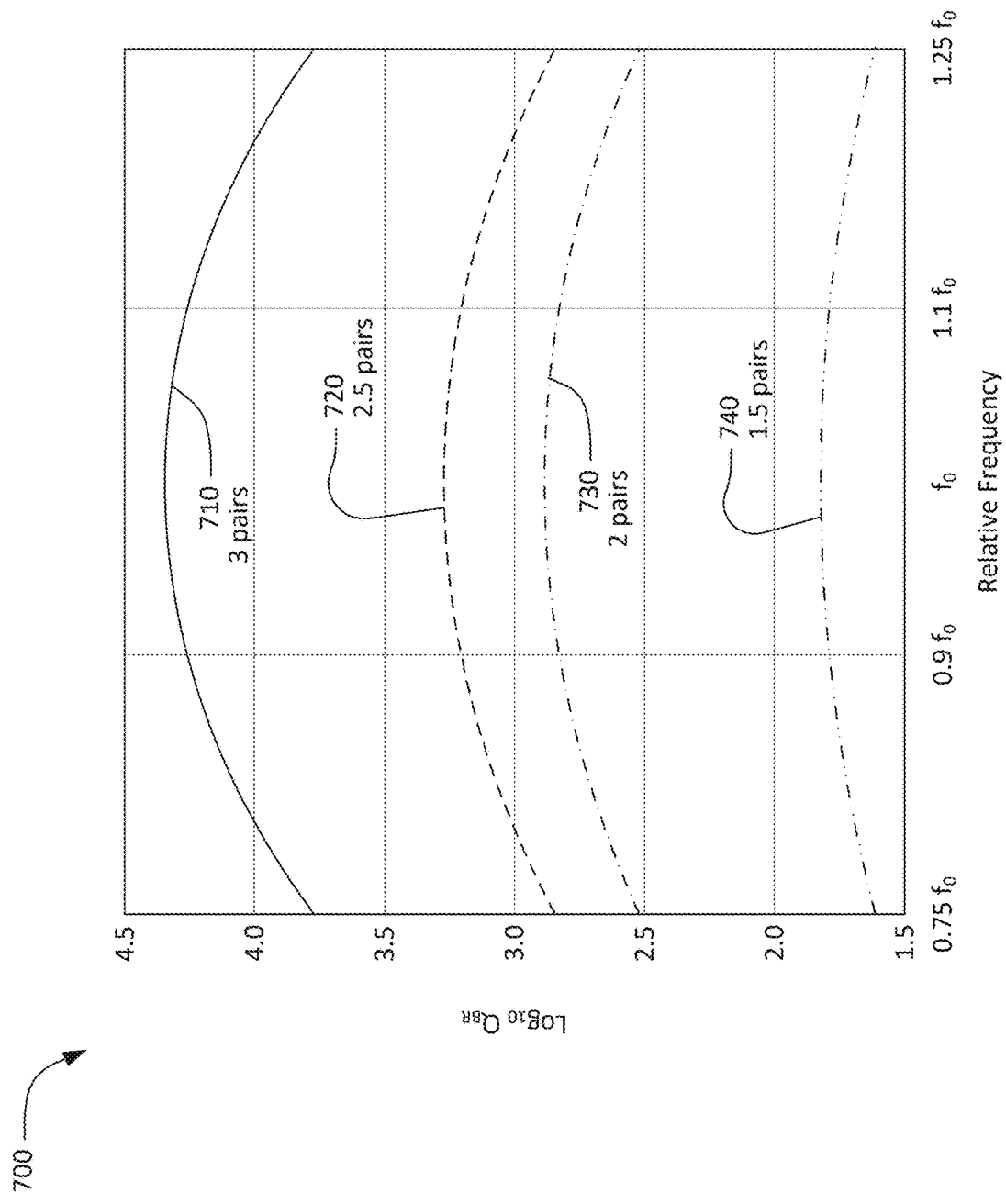
FIG. 7 is a chart showing the dependence of the Q-factor of the SM XBAR of FIG. 6 on the number of layers in the acoustic Bragg reflector.

FIG. 7 is a chart showing the relationship between $Q_{BR}$ and the number of layers in an acoustic Bragg reflector composed of alternating $SiO_2$ and diamond layers. Specifically, FIG. 7 is graph of $Q_{BR}$ versus relative frequency with number of layers as a parameter. $f_0$ is the center frequency of the Bragg reflector, which is to say the frequency at which the effective thickness of the layers of the acoustic Bragg reflector are ¼ wavelength.

The solid line 710 is a plot of $Q_{BR}$ for SM XBARs with an acoustic Bragg reflector with 3 pairs of SiO$_2$/Diamond layers (6 total layers). The dashed line 720 is a plot of $Q_{BR}$ for SM XBARs with an acoustic Bragg reflector with 2.5 pairs of SiO$_2$/Diamond layers (5 total layers). The dot-dash line 730 is a plot of $Q_{BR}$ for SM XBARs with an acoustic Bragg reflector with 2 pairs of SiO$_2$/Diamond layers (4 total layers). The dot-dot-dash line 740 is a plot of $Q_{BR}$ for SM XBARs with an acoustic Bragg reflector with 1.5 pairs of SiO$_2$/Diamond layers (3 total layers). An acoustic Bragg reflector with 2.5 pairs of layers may be sufficient for most XBAR filters. The data shown in FIG. 7 results from simulation using a finite element method.

Figure 8:
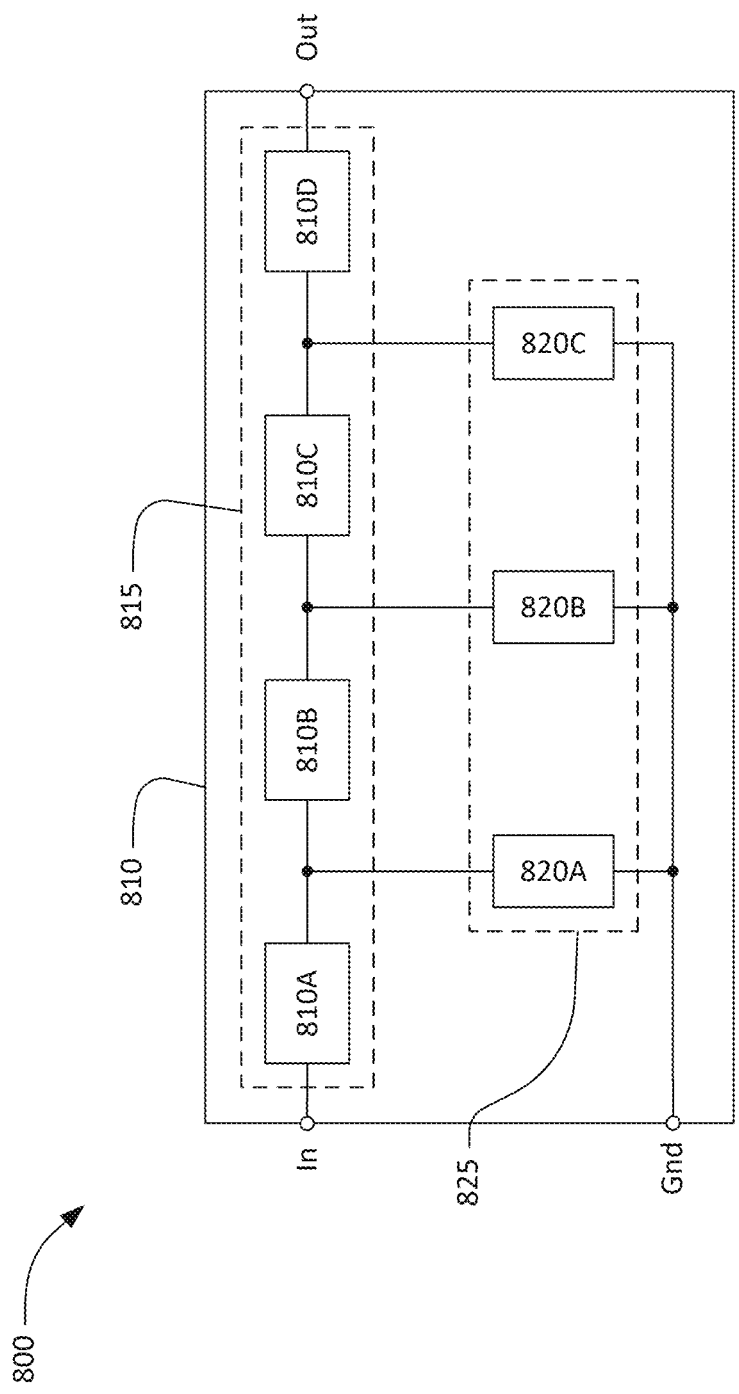
FIG. 8 is a block diagram of a filter including seven SM XBARs.

FIG. 8 is a schematic circuit diagram for a high frequency band-pass filter 800 using SM XBARs. The filter 800 has a conventional ladder filter architecture including four series resonators 810A, 810B, 810C, 810D and three shunt resonators 820A, 820B, 820C. The four series resonators 810A, 810B, 810C, and 810D are connected in series between a first port and a second port. In FIG. 8, the first and second ports are labeled "In" and "Out", respectively. However, the filter 800 is symmetrical and either port and serve as the input or output of the filter. The three shunt resonators 820A, 820B, 820C are connected from nodes between the series resonators to ground. All the shunt resonators and series resonators are SM XBARs.

The filter 800 may include a substrate having a surface, a single-crystal piezoelectric plate having parallel front and back surfaces, and an acoustic Bragg reflector sandwiched between the surface of the substrate and the back surface of the single-crystal piezoelectric plate. The substrate, acoustic Bragg reflector, and piezoelectric plate are represented by the rectangle 810 in FIG. 8. A conductor pattern formed on the front surface of the single-crystal piezoelectric plate includes interdigital transducers (IDTs) for each of the four series resonators 810A, 8110B, 810C, 810D and three shunt resonators 820A, 820B, 820C. All of the IDTs are configured to excite shear acoustic waves in the single-crystal piezoelectric plate in response to respective radio frequency signals applied to each IDT.

In a ladder filter, such as the filter 800, the resonance frequencies of shunt resonators are typically lower than the resonance frequencies of series resonators. The resonance frequency of an SM XBAR resonator is determined, in part, by IDT pitch. IDT pitch also impacts other filter parameters including impedance and power handling capability. For broad-band filter applications, it may not be practical to provide the required difference between the resonance frequencies of shunt and series resonators using only differences in IDT pitch.

As described in U.S. Pat. No. 10,601,392, a first dielectric layer (represented by the dashed rectangle 825) having a first thickness t1 may be deposited over the IDTs of some or all of the shunt resonators 820A, 820B, 820C. A second dielectric layer (represented by the dashed rectangle 815) having a second thickness t2, less than t1 may be deposited over the IDTs of the series resonators 810A, 810B, 810C, 810D. The difference between the thicknesses t1 and t2 defines a frequency offset between the series and shunt resonators. Alternatively or additionally, the series resonators 810A, 810B, 810C, 810D may be formed on a piezoelectric plate having a thickness t3 and the series resonators may be fabricated on a piezoelectric plate having a thickness t4 greater than t3. The difference between the thicknesses t3 and t4 defines a frequency offset between the series and shunt resonators.

Figure 9:
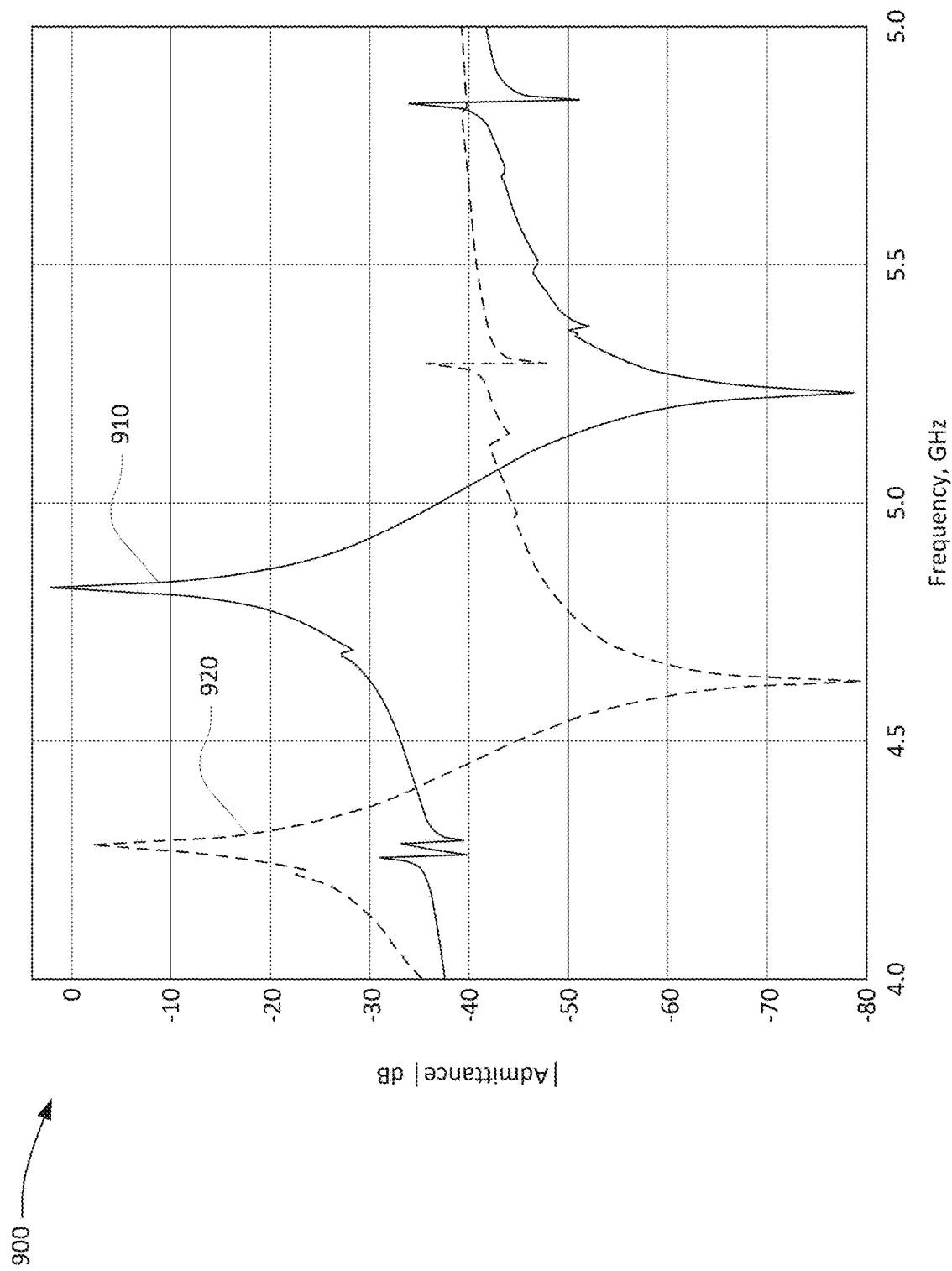
FIG. 9 is a graph showing the magnitude of admittance versus frequency for representative SM-XBARs.

FIG. 9 is a graph 900 that plots the magnitude of admittance versus frequency for two SM XBARs. The solid line 910 is a plot of the admittance of a representative series resonator for use in a ladder filter for 5G NR (5$^{th}$ Generation New Radio) band N79. The dashed line 920 is a plot of the admittance of a representative shunt resonator for the same filter. As previously described, the frequency offset between the series and shunt resonators may result from the shunt resonator having a thicker dielectric layer and/or a thicker piezoelectric plate. The data shown in FIG. 9 results from simulation using a finite element method. The acoustic Bragg reflector was the same for both the series resonator and the shunt resonator. The high Q of the resonance and anti-resonance of both resonators indicates the acoustic Bragg reflector efficiently reflects the shear primary acoustic mode over the frequency range from the resonance of the shut resonator to the anti-resonance of the series resonator.

Figure 10:
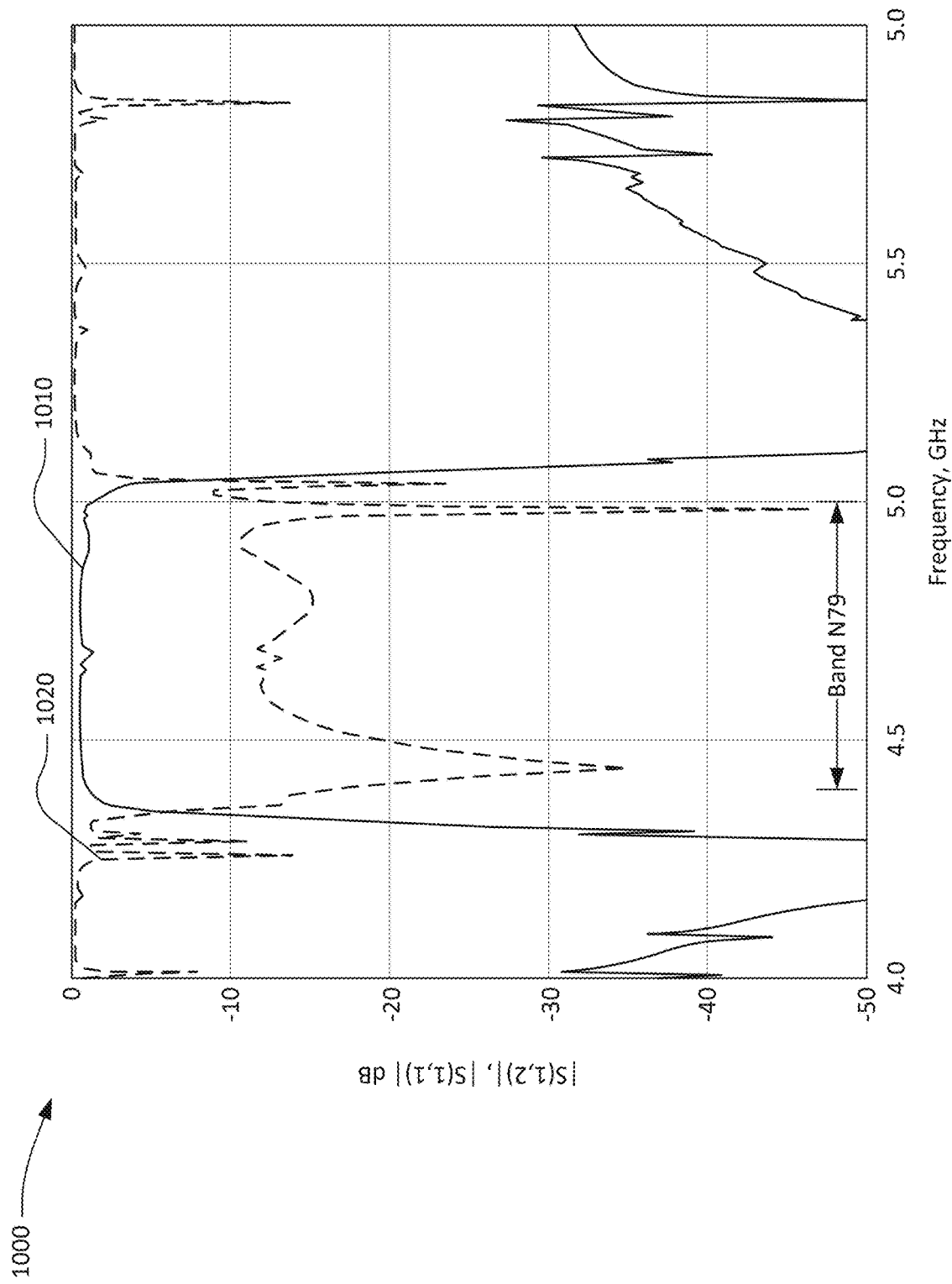
FIG. 10 is a graph of S(1,2) and S(1,1) for a filter implemented with SM-XBARs.

FIG. 10 is a chart 1000 of S-parameters of a Band N79 bandpass filters using seven SM XBARs connected in a ladder circuit as shown in FIG. 8. The solid line 1010 is a plot of S(1,2), which is the input-output transfer function of the filter. The dashed line S(1,1) 1020 is the reflection at the input port of the filter. All seven XBARs include an acoustic Bragg reflector with 2.5 pairs of layers as shown in FIG. 6. The low acoustic impedance layers are SiO$_2$ 195 nm thick. The high acoustic impedance layers are diamond 610 nm thick. The use of the same acoustic Bragg reflector for both series and shunt resonators simplifies fabrication of the filter. The data shown in FIG. 10 results from simulation using a finite element method.

Description of Methods

Figure 11:
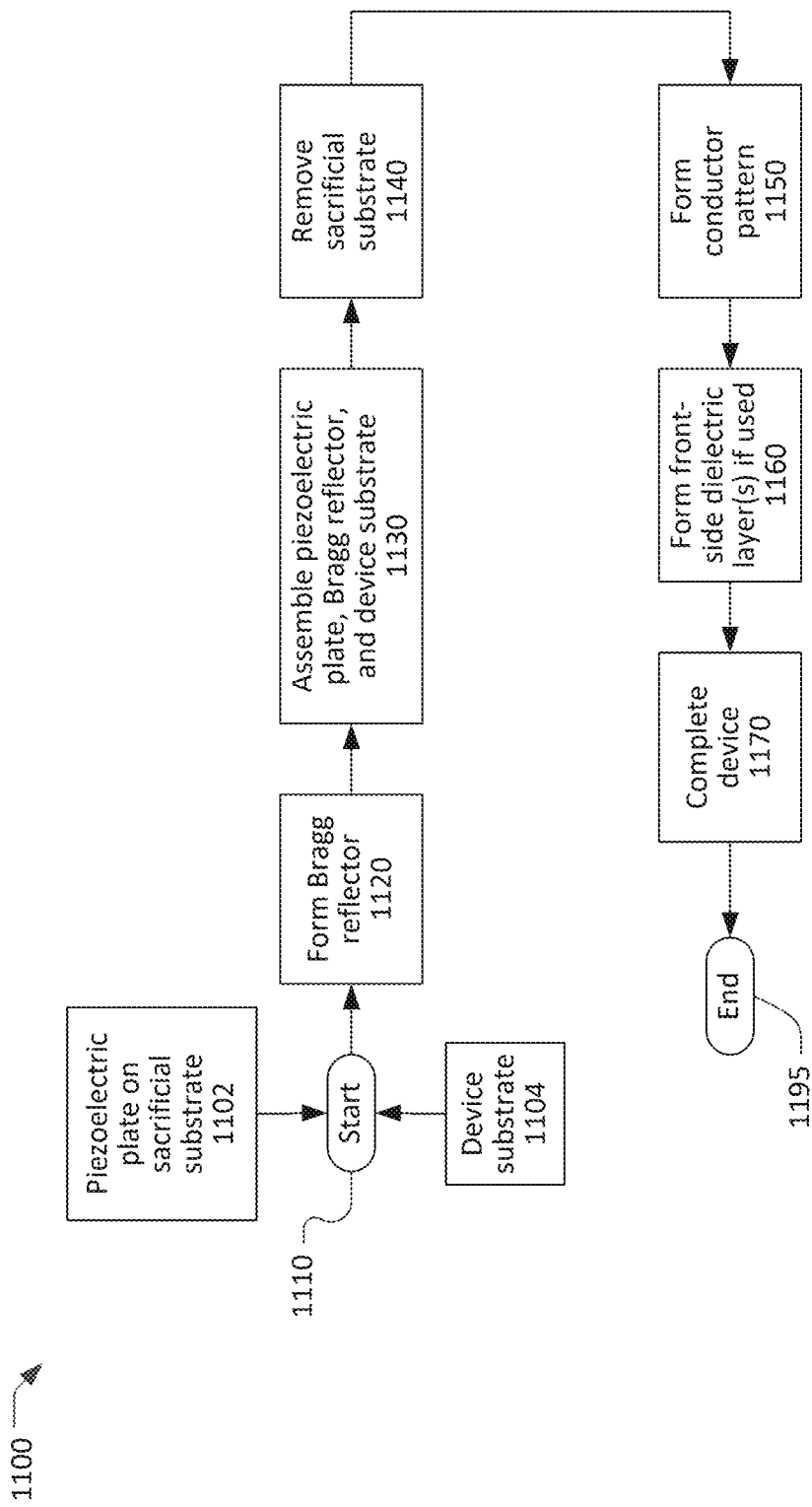
FIG. 11 is a flow chart for a process to fabricate an SM-XBAR.

FIG. 11 is a simplified flow chart of a method 1100 for making a SM XBAR or a filter incorporating SM XBARs. The method 1100 starts at 1110 with a piezoelectric film disposed on a sacrificial substrate 1102 and a device substrate 1104. The method 1110 ends at 1195 with a completed SM XBAR or filter. The flow chart of FIG. 11 includes only major process steps. Various conventional process steps (e.g. surface preparation, cleaning, inspection, baking, annealing, monitoring, testing, etc.) may be performed before, between, after, and during the steps shown in FIG. 11.

Thin plates of single-crystal piezoelectric materials bonded to a non-piezoelectric substrate are commercially available. At the time of this application, both lithium niobate and lithium tantalate plates are available bonded to various substrates including silicon, quartz, and fused silica. Thin plates of other piezoelectric materials may be available now or in the future. The thickness of the piezoelectric plate may be between 300 nm and 1000 nm. When the substrate is silicon, a layer of SiO2 may be disposed between the piezoelectric plate and the substrate. The piezoelectric plate 1102 may be, for example, z-cut lithium niobate with a thickness of 400 nm (as used in all of the previous examples) bonded to a silicon wafer with an intervening SiO2 layer. The device substrate 1104 may be silicon (as used in the previous examples) fused silica, quartz, or some other material.

At 1120 an acoustic Bragg reflector is formed by depositing alternating layers of SiO$_2$ and diamond. Each of the layers has a thickness equal to or about one-fourth of the acoustic wavelength. The total number of layers in the acoustic Bragg reflector may be from five to seven.

At 1120, all of the layers of the acoustic Bragg reflector may be deposited on either the surface of the piezoelectric plate on the sacrificial substrate 1102 or a surface of the device substrate 1104. Alternatively, some of the layers of the acoustic Bragg reflector may be deposited on the surface of the piezoelectric plate on the sacrificial substrate 1102 and the remaining layers of the acoustic Bragg reflector may be deposited on a surface of the device substrate 1104.

At 1130, the piezoelectric plate on the sacrificial substrate 1102 and the device substrate 1104 may be bonded such that the layers of the acoustic Bragg reflector are sandwiched between the piezoelectric plate and the device substrate. The piezoelectric plate on the sacrificial substrate 1102 and the device substrate 1104 may be bonded using a wafer bonding process such as direct bonding, surface-activated or plasma-activated bonding, electrostatic bonding, or some other bonding technique. Note that, when one or more layers of the acoustic Bragg reflector are deposited on both the piezoelectric plate and the device substrate, the bonding will occur between or within layers of the acoustic Bragg reflector.

After the piezoelectric plate on the sacrificial substrate 1102 and the device substrate 1104 may be bonded, the sacrificial substrate, and any intervening layers, are removed at 1140 to expose the surface of the piezoelectric plate (the surface that previously faced the sacrificial substrate). The sacrificial substrate may be removed, for example, by material-dependent wet or dry etching or some other process.

A conductor pattern, including IDTs of each SM XBAR, is formed at 1150 by depositing and patterning one or more conductor layers on the surface of the piezoelectric plate that was exposed when the sacrificial substrate was removed at 1140. The conductor pattern may be, for example, aluminum, an aluminum alloy, copper, a copper alloy, or some other conductive metal. Optionally, one or more layers of other materials may be disposed below (i.e. between the conductor layer and the piezoelectric plate) and/or on top of the conductor layer. For example, a thin film of titanium, chrome, or other metal may be used to improve the adhesion between the conductor layer and the piezoelectric plate. A conduction enhancement layer of gold, aluminum, copper or other higher conductivity metal may be formed over portions of the conductor pattern (for example the IDT bus bars and interconnections between the IDTs).

The conductor pattern may be formed at 1150 by depositing the conductor layer and, optionally, one or more other metal layers in sequence over the surface of the piezoelectric plate. The excess metal may then be removed by etching through patterned photoresist. The conductor layer can be etched, for example, by plasma etching, reactive ion etching, wet chemical etching, and other etching techniques.

Alternatively, the conductor pattern may be formed at 1150 using a lift-off process. Photoresist may be deposited over the piezoelectric plate. and patterned to define the conductor pattern. The conductor layer and, optionally, one or more other layers may be deposited in sequence over the surface of the piezoelectric plate. The photoresist may then be removed, which removes the excess material, leaving the conductor pattern.

At 1160, one or more optional front-side dielectric layers may be formed by depositing one or more layers of dielectric material on the front side of the piezoelectric plate. The one or more dielectric layers may be deposited using a conventional deposition technique such as sputtering, evaporation, or chemical vapor deposition. The one or more dielectric layers may be deposited over the entire surface of the piezoelectric plate, including on top of the conductor pattern. Alternatively, one or more lithography processes (using photomasks) may be used to limit the deposition of the dielectric layers to selected areas of the piezoelectric plate, such as only between the interleaved fingers of the IDTs. Masks may also be used to allow deposition of different thicknesses of dielectric materials on different portions of the piezoelectric plate. For example, a first dielectric layer having a first thickness t1 may be deposited over the IDTs of one or more shunt resonators. A second dielectric layer having a second thickness t2, where t2 is equal to or greater than zero and less than t1, may be deposited over the IDTs of series resonators.

After the conductor pattern and optional front-side dielectric layer are formed at 1150 and 1160, the filter device may be completed at 1170. Actions that may occur at 1170 including depositing and patterning additional metal layers to form conductors other than the IDT conductor pattern; depositing an encapsulation/passivation layer such as $SiO_2$ or $Si_3O_4$ over all or a portion of the device; forming bonding pads or solder bumps or other means for making connection between the device and external circuitry; excising individual devices from a wafer containing multiple devices; other packaging steps; and testing. Another action that may occur at 1170 is to tune the resonant frequencies of the resonators within the device by adding or removing metal or dielectric material from the front side of the device. After the filter device is completed, the process ends at 1195.

A variation of the process 1100 starts with a single-crystal piezoelectric wafer at 1102 instead of a thin piezoelectric plate on a sacrificial substrate of a different material. Ions are implanted to a controlled depth beneath a surface of the piezoelectric wafer (not shown in FIG. 11). The portion of the wafer from the surface to the depth of the ion implantation is (or will become) the thin piezoelectric plate and the balance of the wafer is the sacrificial substrate. The acoustic Bragg reflector is formed at 1120 as previously described and the piezoelectric wafer and device substrate are bonded at 1130 such that the acoustic Bragg reflector is disposed between the ion-implanted surface of the piezoelectric wafer 1102 and the device substrate 1104. At 1140, the piezoelectric wafer may be split at the plane of the implanted ions (for example, using thermal shock), leaving a thin plate of piezoelectric material exposed and bonded to the acoustic Bragg reflector. The thickness of the thin plate piezoelectric material is determined by the energy (and thus depth) of the implanted ions. The process of ion implantation and subsequent separation of a thin plate is commonly referred to as "ion slicing".

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. An acoustic resonator device comprising:
   a substrate having a surface;
   a single-crystal piezoelectric plate having front and back surfaces;
   an interdigital transducer (IDT) formed on the front surface of the single-crystal piezoelectric plate, the IDT and the single-crystal piezoelectric plate configured such that a radio frequency signal applied to the IDT excites a primary acoustic mode within the single-crystal piezoelectric plate, and
   an acoustic Bragg reflector sandwiched between the surface of the substrate and the back surface of the single-crystal piezoelectric plate, the acoustic Bragg reflector configured to reflect the primary acoustic mode, wherein
   the acoustic Bragg reflector is comprised of alternating diamond and $SiO_2$ layers.

2. The device of claim 1, wherein the single-crystal piezoelectric plate is one of lithium niobate and lithium tantalate.

3. The device of claim 2, wherein
   the single-crystal piezoelectric plate is one of Z-cut, rotated Z-cut, and rotated Y-cut.

4. The device of claim 2, wherein
   the primary acoustic mode is a shear acoustic mode.

5. The device of claim 1, wherein the acoustic Bragg reflector is configured to reflect the primary acoustic mode over a frequency range including a resonance frequency and an anti-resonance frequency of the acoustic resonator device.

6. The device of claim 1 wherein acoustic Bragg reflector consists of least four layers and not more than seven layers.

7. The device of claim 1, wherein a thickness between the front and back surfaces of the piezoelectric plate is greater than or equal to 200 nm and less than or equal to 1000 nm.

8. The device of claim 1, wherein a pitch of the fingers of the IDT is greater than or equal to 3 times the thickness of the piezoelectric plate and less than or equal to 12.5 times the thickness of the piezoelectric plate.

9. The device of claim 8, wherein
   the fingers of the IDT have a width, and
   the width is greater than or equal to 0.2 times the pitch and less than or equal to 0.35 times the pitch.

10. A filter device comprising:
    a substrate having a surface;
    a single-crystal piezoelectric plate having parallel front and back surfaces;
    a conductor pattern formed on the front surface of the single-crystal piezoelectric plate, the conductor pattern including a plurality of interdigital transducers (IDTs) of a respective plurality of resonators, the piezoelectric plate and all the plurality of IDTs are configured such that respective radio frequency signals applied to the IDTs excite respective primary acoustic modes in the single-crystal piezoelectric plate; and
    an acoustic Bragg reflector sandwiched between the surface of the substrate and the back surface of the single-crystal piezoelectric plate, the acoustic Bragg reflector configured to reflect the respective primary acoustic modes excited by all of the plurality of IDTs, wherein
    the acoustic Bragg reflector is comprised of alternating diamond and $SiO_2$ layers.

11. The filter device of claim 10, wherein the piezoelectric plate is one of lithium niobate and lithium tantalate.

12. The filter device of claim 11, wherein
    the single-crystal piezoelectric plate is one of Z-cut, rotated Z-cut, and rotated Y-cut.

13. The filter device of claim 11, wherein
    the primary acoustic modes excited by all of the plurality of IDTs are shear acoustic modes.

14. The filter device of claim 10, wherein the acoustic Bragg reflector is configured to reflect the primary acoustic modes over a frequency range including a resonance frequency and an anti-resonance frequency of all of the plurality of resonators.

15. The filter device of claim 10 wherein the acoustic Bragg reflector consists of at least four layers and not more than seven layers.

16. The filter device of claim 10, wherein a thickness between the front and back surfaces of the piezoelectric plate is greater than or equal to 200 nm and less than or equal to 1000 nm.

17. The filter device of claim 10, wherein a pitch of the fingers of all of the plurality of IDTs is greater than or equal to 3 times the thickness of the piezoelectric plate and less than or equal to 12.5 times the thickness of the piezoelectric plate.

18. A method of fabricating an acoustic resonator device comprising:
    forming an acoustic Bragg reflector by depositing material layers on one or both of a surface of a device substrate and a first surface of a single-crystal piezoelectric plate having a second surface attached to a sacrificial substrate;
    bonding the single-crystal piezoelectric plate attached to the sacrificial substrate to the device substrate such that the layers of the acoustic Bragg reflector are sandwiched between the first surface of the single-crystal piezoelectric plate and the surface of the device substrate;
    removing the sacrificial substrate to expose the second surface of the single-crystal piezoelectric plate; and
    forming an interdigital transducer (IDT) on the second surface of the single-crystal piezoelectric plate, the single-crystal piezoelectric plate and the IDT configured such that a radio frequency signal applied to the IDT excites a primary acoustic mode within the single-crystal piezoelectric plate, wherein
    the acoustic Bragg reflector comprises alternating $SiO_2$ and diamond layers and is configured to reflect the primary acoustic mode.

19. A method of fabricating a filter device, the method comprising:
    forming an acoustic Bragg reflector by depositing material layers on one or both of a surface of a device substrate and a first surface of a single-crystal piezoelectric plate having a second surface attached to a sacrificial substrate;

bonding the single-crystal piezoelectric plate attached to the sacrificial substrate to the device substrate such that the layers of the acoustic Bragg reflector are sandwiched between the first surface of the single-crystal piezoelectric plate and the surface of the device substrate;

removing the sacrificial substrate to expose the second surface of the single-crystal piezoelectric plate; and forming a conductor pattern on the second surface of the single-crystal piezoelectric plate, the conductor pattern including a plurality of interdigital transducers (IDTs) of a respective plurality of resonators including a shunt resonator, wherein the single-crystal piezoelectric plate and all of the plurality of IDTs are configured such that respective radio frequency signals applied to the IDTs excite respective primary acoustic modes within the single-crystal piezoelectric plate, and the acoustic Bragg reflector comprises alternating $SiO_2$ and diamond layers and is configured to reflect the primary acoustic modes.

* * * * *